United States Patent
Chen

(10) Patent No.: US 7,121,327 B2
(45) Date of Patent: Oct. 17, 2006

(54) HEAT SINK ASSEMBLY

(75) Inventor: Yun Lung Chen, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 1024 days.

(21) Appl. No.: 09/750,862

(22) Filed: Dec. 28, 2000

(65) Prior Publication Data

US 2002/0084062 A1 Jul. 4, 2002

(51) Int. Cl.
F28D 15/00 (2006.01)

(52) U.S. Cl. ............... 165/104.34; 165/80.3; 165/104.33; 165/121; 165/122; 165/185; 257/722; 257/714; 361/696; 361/697; 361/700

(58) Field of Classification Search ............. 165/80.3, 165/104.33, 121, 122, 185; 257/722, 714; 361/696, 697, 700

See application file for complete search history.

(56) References Cited

U.S. PATENT DOCUMENTS

| | | | | |
|---|---|---|---|---|
| 1,805,116 A | * | 5/1931 | Trane | |
| 2,216,778 A | * | 10/1940 | Houdry | 165/182 |
| 2,585,912 A | * | 2/1952 | Buschow et al. | 165/10 |
| 2,737,370 A | * | 3/1956 | Frisch et al. | 165/134.1 |
| 3,741,291 A | * | 6/1973 | Limoni | 165/55 |
| 3,780,797 A | * | 12/1973 | Gebelius | 165/55 |
| 4,492,851 A | * | 1/1985 | Carr | 219/201 |
| 4,777,560 A | * | 10/1988 | Herrell et al. | 361/694 |
| 4,928,756 A | * | 5/1990 | Shull et al. | 165/182 |
| 5,020,586 A | * | 6/1991 | Mansingh | 165/80.3 |
| 5,339,214 A | * | 8/1994 | Nelson | 361/695 |
| 5,467,816 A | * | 11/1995 | Larinoff | 165/151 |
| 5,509,465 A | * | 4/1996 | Lai | 165/80.3 |
| 5,959,837 A | * | 9/1999 | Yu | 361/697 |
| 6,189,602 B1 | * | 2/2001 | Tanahashi et al. | 165/86 |
| 6,340,056 B1 | * | 1/2002 | Huang et al. | 165/185 |
| 6,382,307 B1 | * | 5/2002 | Wang et al. | 165/80.3 |
| 6,394,175 B1 | * | 5/2002 | Chen et al. | 165/80.3 |
| 6,401,810 B1 | * | 6/2002 | Kuo et al. | 165/185 |
| 6,435,266 B1 | * | 8/2002 | Wu | 165/80.3 |
| 6,550,529 B1 | * | 4/2003 | Horng et al. | 165/80.3 |
| 6,598,666 B1 | * | 7/2003 | Lin | 165/80.3 |
| 6,625,021 B1 | * | 9/2003 | Lofland et al. | 361/697 |
| 6,640,888 B1 | * | 11/2003 | Horng et al. | 165/185 |
| 6,651,733 B1 | * | 11/2003 | Horng et al. | 165/80.3 |
| 6,675,884 B1 | * | 1/2004 | Shen | 165/181 |
| 6,717,813 B1 | * | 4/2004 | Garner | 361/700 |
| 6,741,468 B1 | * | 5/2004 | Jing et al. | 361/700 |
| 6,745,824 B1 | * | 6/2004 | Lee et al. | 165/104.14 |
| 6,749,011 B1 | * | 6/2004 | Horng et al. | 165/80.3 |
| 6,779,595 B1 | * | 8/2004 | Chiang | 165/104.33 |
| 6,830,098 B1 | * | 12/2004 | Todd et al. | 165/104.33 |
| 6,889,911 B1 | * | 5/2005 | Uglietto et al. | 237/79 |

(Continued)

Primary Examiner—Henry Bennett
Assistant Examiner—Nihir Patel
(74) Attorney, Agent, or Firm—Wei Te Chung

(57) ABSTRACT

A heat sink assembly includes a plurality of fins (10), a pair of ducts (20), and a frame (30) receiving the fins and the ducts therein. Each fin defines a pair of through holes (11) therein. A tapered tab (14) and a plurality of locating tabs (15) extend from each fin around a periphery of each through hole. A pair of locating portions (16) extends horizontally from opposite ends of each fin, for forming intervals between the fins. The ducts are inserted into the corresponding through holes of the fins, and are in thermal contact with the tabs. The fins and the ducts are then placed into the frame to form the heat sink assembly.

15 Claims, 5 Drawing Sheets

U.S. PATENT DOCUMENTS

| | | | |
|---|---|---|---|
| 6,958,915 B1 * | 10/2005 | Wang et al. | 361/709 |
| 6,959,755 B1 * | 11/2005 | Chen | 165/80.3 |
| 6,967,845 B1 * | 11/2005 | Chiang et al. | 361/709 |
| 6,971,243 B1 * | 12/2005 | Scott | 62/3.7 |
| 7,036,566 B1 * | 5/2006 | Huang | 165/104.33 |

* cited by examiner

HEAT SINK ASSEMBLY

BACKGROUND OF THE INVENTION

1. Field of the Invention

The present invention relates to a heat sink assembly, and more particularly to a heat sink assembly which interconnects a heat pipe and a fan for enhancing heat removal capability.

2. Related Art

Computers are continuing to rapidly develop. Electronic devices in computers, such as central processing units (CPUs), generate a lot of heat during normal operation. This can deteriorate their operational stability, and can damage associated electronic devices. Thus the heat must be removed quickly to ensure normal operation of the CPU. A heat sink is often attached to a top surface of the CPU, to remove heat therefrom.

Conventional heat sinks are generally formed by extrusion. Referring to FIG. 5, a conventional heat sink comprises a chassis 1 and a plurality of fins 2 extending from the chassis 1. The chassis 1 is attached to a top surface of a CPU 3, for removing heat therefrom. Unfortunately, limitations of extrusion processes result in the height of the fins 2 being significantly limited.

To meet increasing demands for dissipation of ever-increasing amounts of heat, various fans are available for attaching to the fins and thereby enhancing air convection. However, this further increases the size and weight of the heat dissipation assembly. It therefore becomes more difficult to firmly secure the assembly to a CPU. A variety of clips are available to secure the assembly to a CPU, but this entails further complication and expense. A CPU connector is conventionally welded to a motherboard, for insertion of the CPU therein. Oftentimes the connector cannot sustain the weight of the heat dissipation assembly, and the connector gets torn out from the motherboard. Furthermore, as computers become smaller and smaller, the bulk of the heat dissipation assembly is becoming more and more unsuitable for modern computer configurations.

Therefore, a heat sink assembly which overcomes the above-mentioned problems of the related art is strongly desired.

SUMMARY OF THE INVENTION

Accordingly, an object of the present invention is to provide a heat sink assembly which interconnects a heat pipe and a fan for enhancing heat removal capability.

Another object of the present invention is to provide a heat sink assembly which takes up less space inside a computer.

To achieve the above objects, a heat sink assembly in accordance with the present invention comprises a plurality of fins, a pair of ducts and a frame receiving the fins and the ducts therein. Each fin defines a pair of through holes therein. A tapered tab and a plurality of locating tabs extend from each fin around a periphery of each through hole. A pair of locating portions extends horizontally from opposite ends of each fin, for forming intervals between the fins. The ducts are inserted into the corresponding through holes of the fins, and are in thermal contact with the tabs. The fins and the ducts are then placed into the frame to form the heat sink assembly.

Other objects, advantages and novel features of the present invention will be drawn from the following detailed embodiment of the present invention with attached drawings, in which:

DETAILED DESCRIPTION OF THE PREFERRED EMBODIMENT

Figure 1:
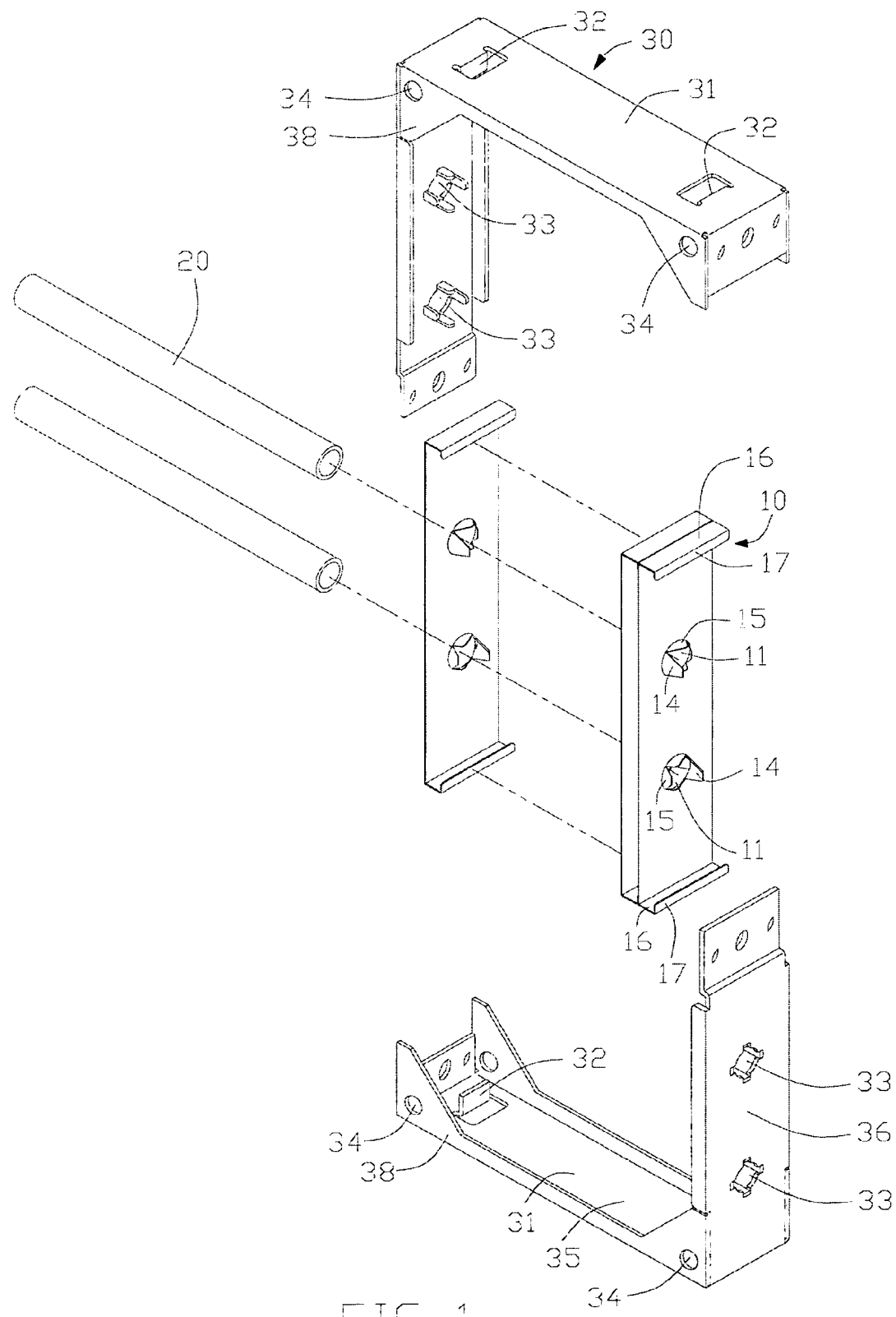
FIG. 1 is an exploded view of a heat sink assembly in accordance with the present invention.
Figure 4:
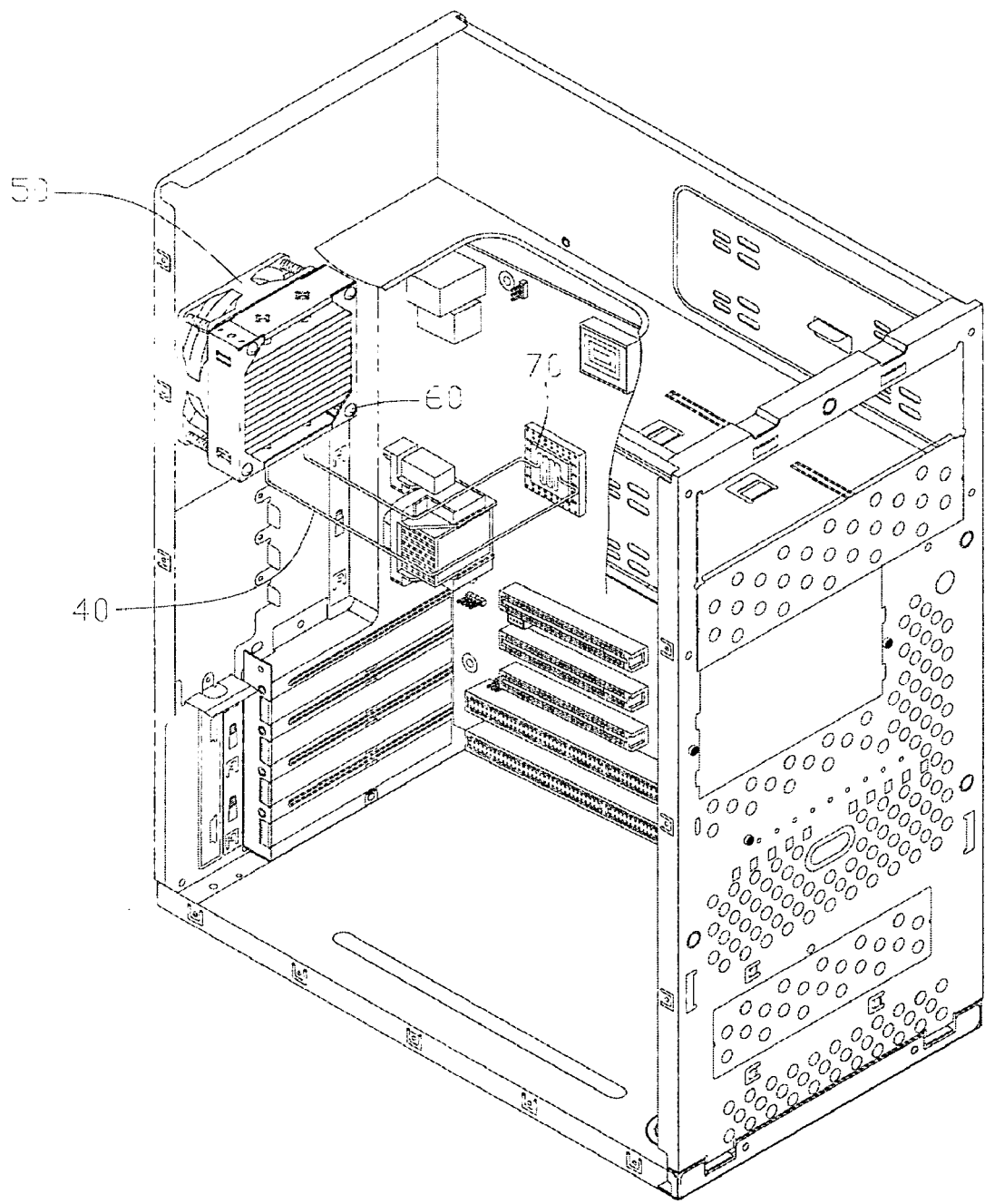
FIG. 4 is an assembled view of the heat sink assembly engaging with a heat pipe and a fan.
Figure 5:
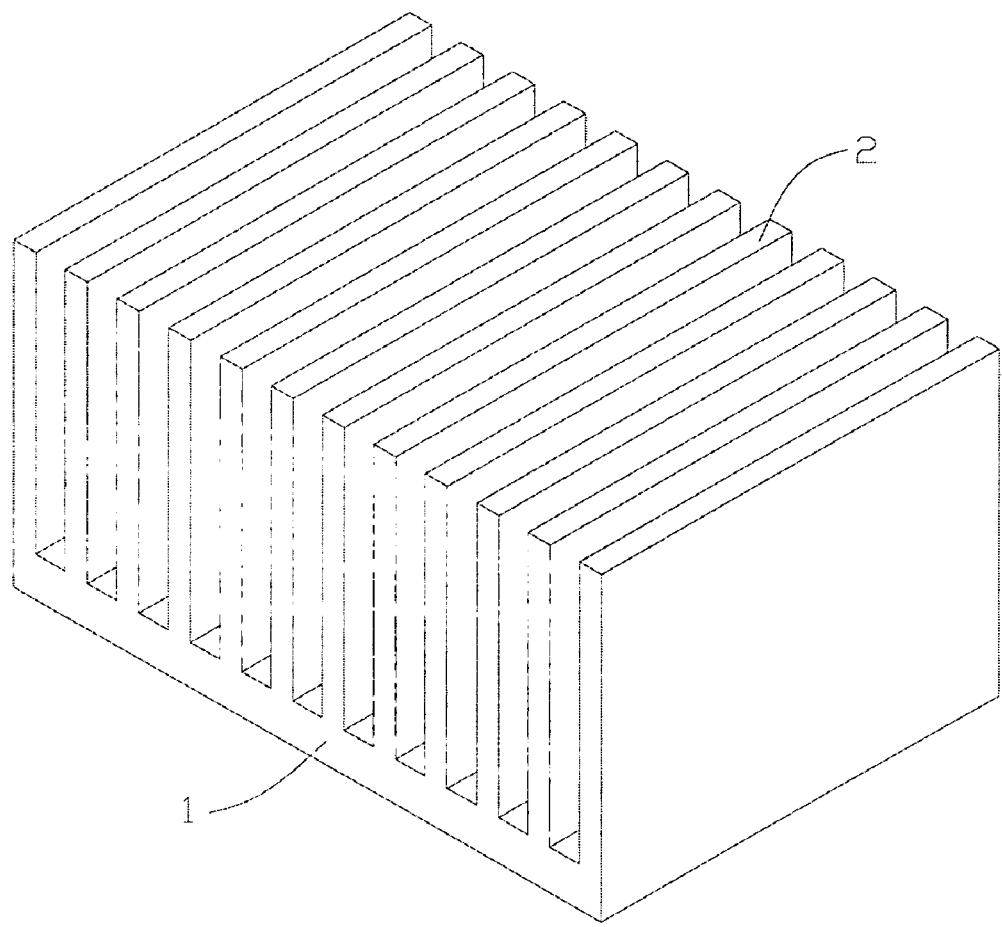
FIG. 5 is a perspective view of a conventional heat sink assembly.
Figure 5:
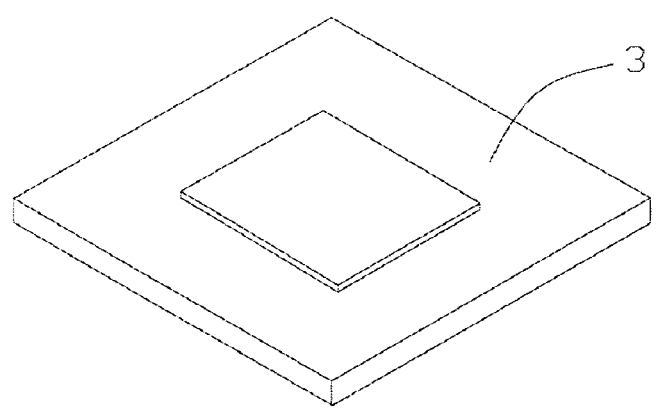

Referring to FIGS. 1 and 4, a heat sink assembly in accordance with the present invention comprises a plurality of fins 10, a pair of ducts 20 and a frame 30 for accommodating the fins 10 and the ducts 20. The ducts 20 are made of highly heat-conductive metal. The heat sink assembly is secured to a fan 50 with four screws 60. The heat sink assembly is also secured to a heat pipe 40, and the heat pipe 40 is connected to a heat-generating electronic device such as a central processing unit (CPU) 70.

Figure 2:
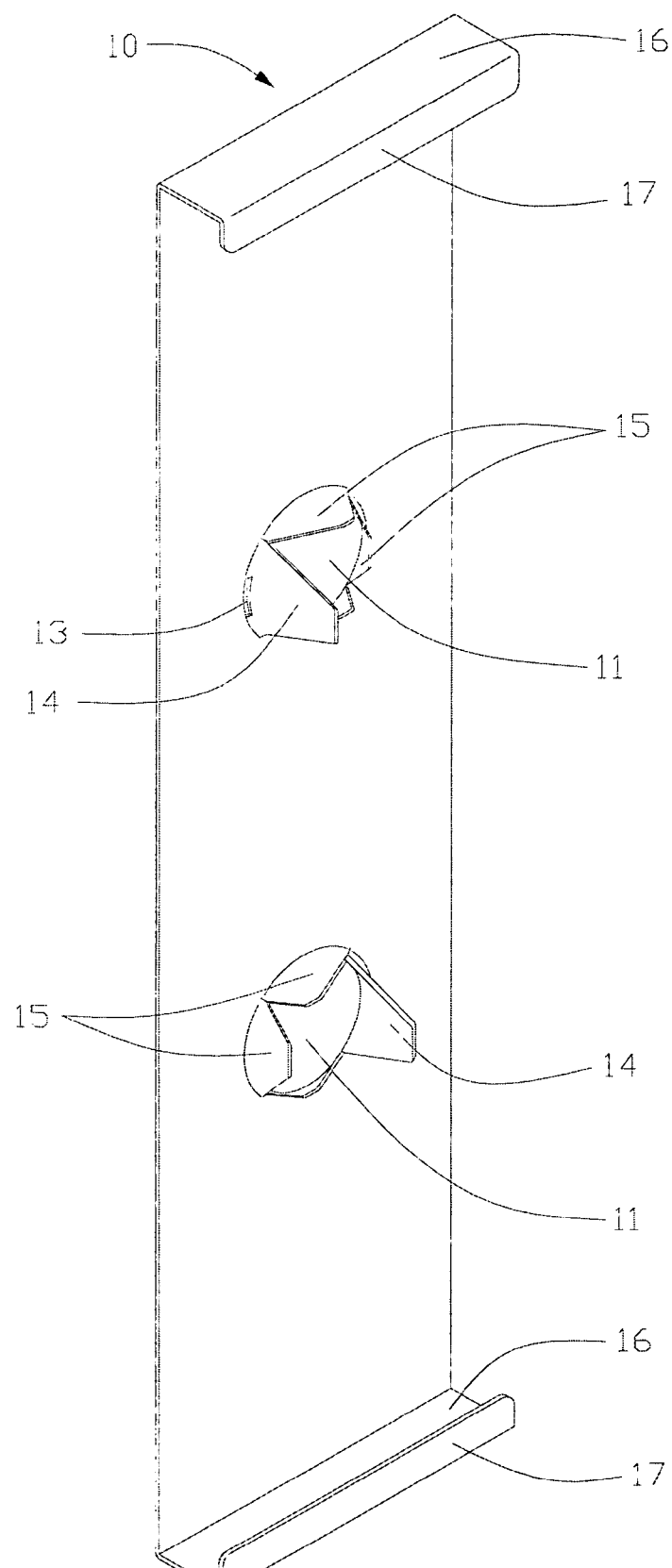
FIG. 2 is a perspective view of a fin of the heat sink assembly of FIG. 1.

Referring particularly to FIG. 2, each fin 10 is formed from a single metal plate. A pair of through holes 11 is defined in each fin 10. A tapered tab 14 and a plurality of locating tabs 15 extend perpendicularly in the same direction from each fin 10 around the periphery of each through hole 11 thereof. An arcuate slot 13 is defined in a base of each tapered tab 14, for receiving an end of a tapered tab 14 of an adjacent fin 10. A pair of locating portions 16 respectively extends horizontally from opposite ends of each fin 10 in the same direction in which the tapered tabs 14 and locating tabs 15 extend, for positioning all adjacent fins 10 at uniform intervals. A pair of abutting flanges 17 respectively extends vertically toward each other from free ends of the locating portions 16, for abutting an adjacent fin 10.

The frame 30 comprises a pair of identical generally L-shaped casings 31. Each casing 31 comprises a horizontal wall 35 and a vertical wall 36. A pair of spaced end tabs 32 is vertically and inwardly stamped near opposite ends of each horizontal wall respectively, for respectively abutting outmost fins 10. The vertical portion 36 defines a pair of spaced latching holes 33 therein, corresponding to the through holes 11 of the fins 10. A pair of reinforcing flanges 38 respectively extends perpendicularly inwardly from opposite lateral edges of each horizontal wall 35. Two screw holes 34 are respectively defined at opposite ends of each reinforcing flange 38, for insertion of screws therethrough to secure the heat sink assembly to the fan 50 (see FIG. 4).

Figure 3:
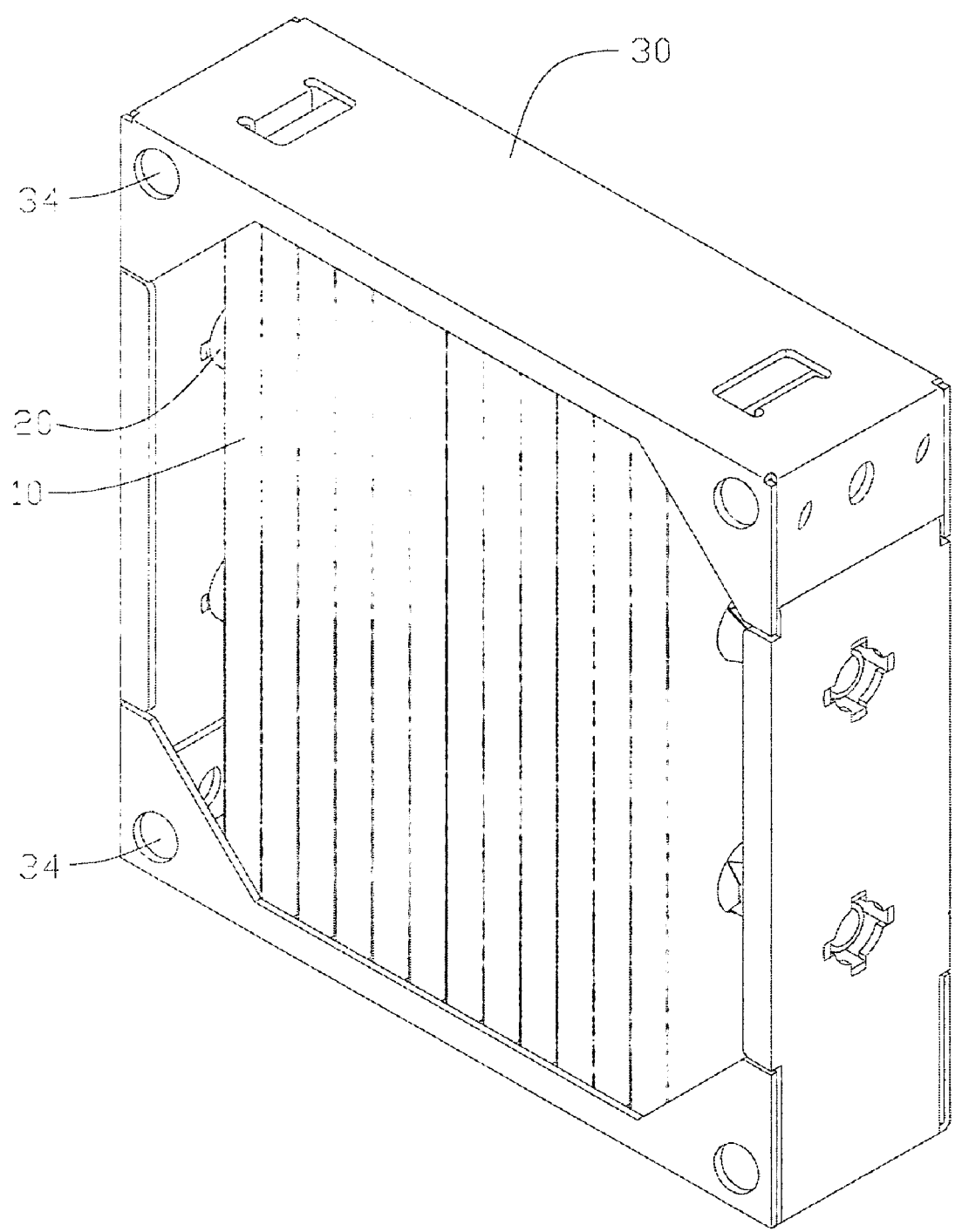
FIG. 3 is an assembled view of FIG. 1.

Referring also to FIG. 3, in assembly, the ducts 20 are extended through the corresponding through holes 11 of the fins 10. The fins 10 are thereby arranged parallel to each other and aligned with each other. The abutting flanges 17 of each fin 10 abut a corresponding adjacent fin 10. The tapered tabs 14 of each fin 10 are inserted into corresponding slots 13 of an adjacent fin 10, thereby preventing the tapered tabs 14 from being deformed. Thus the fins 10 are connected together at uniform intervals, and the tapered tabs 14 firmly abut against the ducts 20. The fins 10 at the through holes 11 and the locating tabs 15 also firmly abut the ducts 20. The assembly of the fins 10 and the ducts 20 is then placed onto the horizontal wall 35 of one casing 31. The end tabs 32 of such casing 31 respectively abut bottom portions of two outmost fins 10. The other casing 31 is then covered over the fins 10. The end tabs 32 of the other casing 31 respectively abut top portions of the two outmost fins 10. Thus all fins 10 are secured between the opposite end tabs 32 of each casing 31. Ends of the ducts 20 are interferentially received in the corresponding latching holes 33 of the vertical portions 36 of the casings 31. Finally, the casings 31 are secured together by conventional means to form the heat sink assembly.

Referring also to FIG. 4, in installation, free ends (not labeled) of the heat pipe 40 are interferentially inserted into the corresponding ducts 20 to slightly expand the ducts 20. Thus the ducts 20 firmly abut the tapered tabs 14 and locating tabs 15 of the fins 10, and also the fins 10 themselves at the through holes 11. The ducts 20 thereby provide great heat dissipation capability for the heat sink assembly. The screws 60 are inserted into the corresponding screw holes 34, to engage with the fan 50 and thereby secure the heat sink assembly to the fan 50. The heat pipe 40 is then attached to the CPU 70, to conduct heat therefrom.

It is understood that the invention may be embodied in other forms without departing from the spirit thereof. Thus, the present example and embodiment is to be considered in all respects as illustrative and not restrictive, and the invention is not to be limited to the details given herein.

The invention claimed is:

1. A heat sink assembly comprising:
a frame;
a plurality of fins spacedly received in the frame, each of the fins defining a through hole and forming a connecting tab extending around a periphery of the through hole, a slot being defined in the connecting tab of each of the fins and receiving an end of the connecting tab of an adjacent one of the fins; and
a duct inserted through the through hole of each of the fins and in thermal contact with the connecting tabs;
wherein the frame comprises a pair of generally L-shaped casings connected together;
wherein a pair of reinforcing flanges extends inwardly from opposite lateral edges of a horizontal wall of each of the casings, and at least one screw hole is defined in each of the reinforcing flanges for securing the heat sink assembly to a fan.

2. The heat sink assembly as recited in claim 1, wherein a pair of locating portions extends from each of the fins for forming intervals between the fins.

3. The heat sink assembly as recited in claim 2, wherein a pair of abutting flanges respectively extends vertically toward each other from free ends of the locating portions of each of the fins, for abutting an adjacent one of the fins.

4. The heat sink assembly as recited in claim 1, wherein the duct is made of highly heat-conductive metal.

5. The heat sink assembly as recited in claim 1, wherein at least one of the casings defines a pair of end tabs for abutting outmost fins.

6. The heat sink assembly as recited in claim 1, wherein a latching hole is defined in each of the casings for interferentially engaging with the duct.

7. A heat sink system comprising:
a fan;
a heat pipe adapted to be attached to a heat-generating electronic device, the heat pipe comprising a free end; and
a heat sink comprising a frame secured to the fan, a plurality of fins and a duct, the fins and the duct being accommodated in the frame, each of the fins defining a through hole for insertion of the duct therein, a tapered tab and at least one locating tab extending from each of the fins around a periphery of the through hole for abutting the duct, the frame defining a latching hole for interferentially engaging with an end of the duct, the duct interferentially receiving the free end of the heat pipe therein.

8. The heat sink system as recited in claim 7, wherein a pair of locating portions extends from each of the fins, for forming intervals between the fins.

9. The heat sink system as recited in claim 8, wherein a pair of abutting flanges respectively extends vertically toward each other from free ends of the locating portions of each of the fins, for abutting an adjacent one of the fins.

10. The heat sink system as recited in claim 7, wherein the duct is made of highly heat-conductive metal.

11. The heat sink system as recited in claim 7, wherein the frame comprises a pair of generally L-shaped casings connected together.

12. The heat sink system as recited in claim 11, wherein at least one of the casings defines a pair of end tabs for abutting outmost fins.

13. The heat sink system as recited in claim 11, wherein a latching hole is defined in each of the casings for interferentially engaging with the duct.

14. The heat sink system as recited in claim 11, wherein a pair of reinforcing flanges extends inwardly from opposite lateral edges of a horizontal wall of each of the casings, and at least one screw hole is defined in each of the reinforcing flanges for securing the heat sink system to the fan.

15. The heat sink system as recited in claim 1, wherein each of the fin is made of a single metal plate.

* * * * *